(12) United States Patent
Sugakawa et al.

(10) Patent No.: US 11,715,663 B2
(45) Date of Patent: Aug. 1, 2023

(54) BONDING APPARATUS, BONDING SYSTEM, BONDING METHOD AND RECORDING MEDIUM

(71) Applicant: Tokyo Electron Limited, Tokyo (JP)

(72) Inventors: Kenji Sugakawa, Koshi (JP); Yosuke Omori, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 15 days.

(21) Appl. No.: 17/181,021

(22) Filed: Feb. 22, 2021

(65) Prior Publication Data

US 2021/0272836 A1    Sep. 2, 2021

(30) Foreign Application Priority Data

Mar. 2, 2020    (JP) .................................. 2020-035113

(51) Int. Cl.
| | |
|---|---|
| *B29C 65/00* | (2006.01) |
| *H01L 21/683* | (2006.01) |
| *B65H 5/22* | (2006.01) |
| *B29C 65/78* | (2006.01) |

(52) U.S. Cl.
CPC ......... *H01L 21/6838* (2013.01); *B65H 5/226* (2013.01); *B29C 65/004* (2013.01); *B29C 65/782* (2013.01); *B29C 65/7847* (2013.01); *B29C 66/81421* (2013.01); *B29C 66/81455* (2013.01)

(58) Field of Classification Search
CPC . B29C 65/004; B29C 65/782; B29C 65/7847; B29C 66/81421; B29C 66/81455; H10L 21/6838
See application file for complete search history.

(56) References Cited

U.S. PATENT DOCUMENTS

| | | | | |
|---|---|---|---|---|
| 9,498,944 | B2* | 11/2016 | Izumi ................ | H01L 21/68785 |
| 2012/0329241 | A1* | 12/2012 | Yamaguchi ....... | H01L 21/67092 |
| | | | | 438/455 |
| 2015/0210057 | A1* | 7/2015 | Wagenleithner ...... | B32B 37/003 |
| | | | | 156/290 |

(Continued)

FOREIGN PATENT DOCUMENTS

JP    2014-229787 A    12/2014

*Primary Examiner* — Philip C Tucker
*Assistant Examiner* — Nickolas R Harm
(74) *Attorney, Agent, or Firm* — Pearne & Gordon LLP (57) ABSTRACT

A bonding apparatus includes a first holder, a first transforming device, a second holder, a second transforming device, a suction device and a control device. The first holder attracts and holds a first substrate from above. The first transforming device transforms the first substrate held by the first holder such that a central portion of the first substrate is protruded downwards. The second holder is provided under the first holder, and attracts and holds a second substrate, which is to be bonded to the first substrate, from below. The second transforming device transforms the second substrate held by the second holder such that a central portion of the second substrate is protruded upwards. The suction device generates different attracting forces in multiple division regions included in an attraction region of the second substrate. The control device controls the suction device.

10 Claims, 7 Drawing Sheets

(56) References Cited

U.S. PATENT DOCUMENTS

| | | | | |
|---|---|---|---|---|
| 2015/0357226 | A1* | 12/2015 | Liu | B23B 31/305 |
| | | | | 438/457 |
| 2016/0204020 | A1* | 7/2016 | Huang | H01L 21/6838 |
| | | | | 156/60 |
| 2017/0221856 | A1* | 8/2017 | Yamauchi | B23K 20/233 |
| 2018/0047699 | A1* | 2/2018 | Omori | H01L 24/743 |
| 2018/0144999 | A1* | 5/2018 | Lu | H01L 24/94 |
| 2020/0365442 | A1* | 11/2020 | Sugakawa | H01L 21/02 |

* cited by examiner

BONDING APPARATUS, BONDING SYSTEM, BONDING METHOD AND RECORDING MEDIUM

CROSS-REFERENCE TO RELATED APPLICATION

This application claims the benefit of Japanese Patent Application No. 2020-035113 filed on Mar. 2, 2020, the entire disclosure of which is incorporated herein by reference.

TECHNICAL FIELD

The various aspects and embodiments described herein pertain generally to a bonding apparatus, a bonding system, a bonding method and a recording medium.

BACKGROUND

Patent Document 1 describes a bonding apparatus configured to bond substrates by transforming a substrate at an upper side such that a central portion thereof is protruded downwards.

Patent Document 1: Japanese Patent Laid-open Publication No. 2014-229787

SUMMARY

In one exemplary embodiment, a bonding apparatus includes a first holder, a first transforming device, a second holder, a second transforming device, a suction device and a control device. The first holder is configured to attract and hold a first substrate from above. The first transforming device is configured to transform the first substrate held by the first holder such that a central portion of the first substrate is protruded downwards. The second holder is provided under the first holder, and is configured to attract and hold a second substrate, which is to be bonded to the first substrate, from below. The second transforming device is configured to transform the second substrate held by the second holder such that a central portion of the second substrate is protruded upwards. The suction device is configured to generate different attracting forces in multiple division regions included in an attraction region of the second substrate. The control device is configured to control the suction device.

The foregoing summary is illustrative only and is not intended to be any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

DETAILED DESCRIPTION

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

Hereinafter, embodiments for a bonding apparatus, a bonding system, a bonding method and a recording medium according to the present disclosure (hereinafter, referred to as "exemplary embodiments") will be described in detail with reference to the accompanying drawings. Further, it should be noted that the bonding apparatus, the bonding system, the bonding method and the recording medium according to the present disclosure are not limited by the exemplary embodiments. Further, unless processing contents are contradictory, the various exemplary embodiments can be appropriately combined. Furthermore, in the various exemplary embodiments to be described below, same parts will be assigned same reference numerals, and redundant description will be omitted.

Further, in the various accompanying drawings, for the purpose of clear understanding, there may be used a rectangular coordinate system in which the X-axis direction, Y-axis direction and Z-axis direction which are orthogonal to one another are defined and the positive Z-axis direction is defined as a vertically upward direction. The X-axis direction and the Y-axis direction are horizontal directions. In the following description, the positive Z-axis direction may sometimes be regarded as an upper side, whereas the negative Z-axis direction may be regarded as a lower side.

<Configuration of Bonding System>

Figure 1:
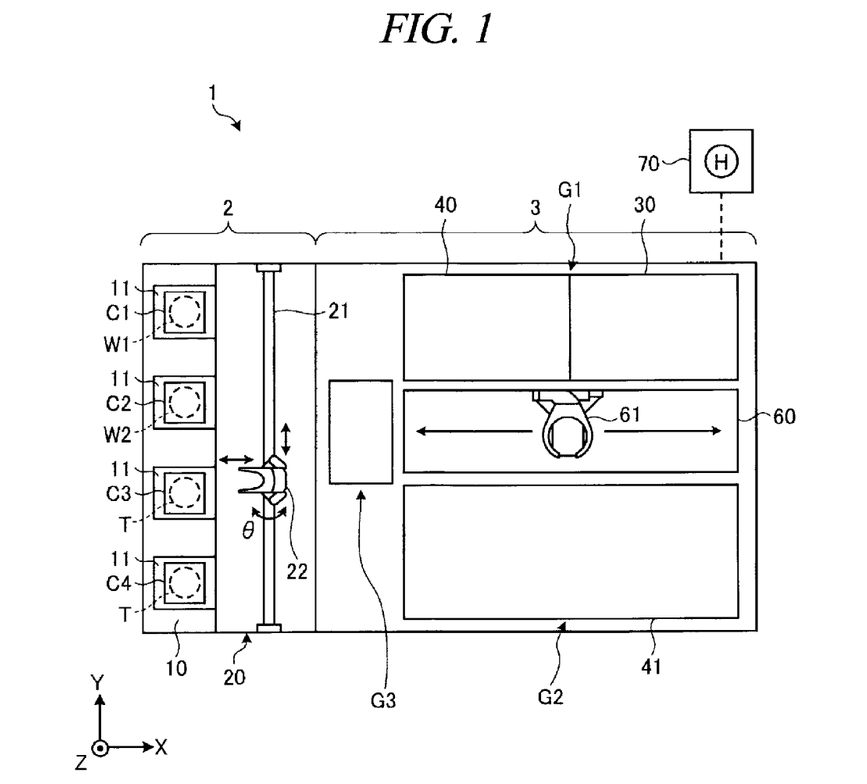
FIG. 1 is a schematic diagram illustrating a configuration of a bonding system according to an exemplary embodiment.

First, a configuration of a boding system 1 according to an exemplary embodiment will be described with reference to FIG. 1 and FIG. 2. FIG. 1 is a schematic diagram illustrating the configuration of the bonding system 1 according to the exemplary embodiment. Further, FIG. 2 is a schematic diagram illustrating a state of a first substrate W1 and a second substrate W2 before they are bonded according to the exemplary embodiment.

Figure 2:
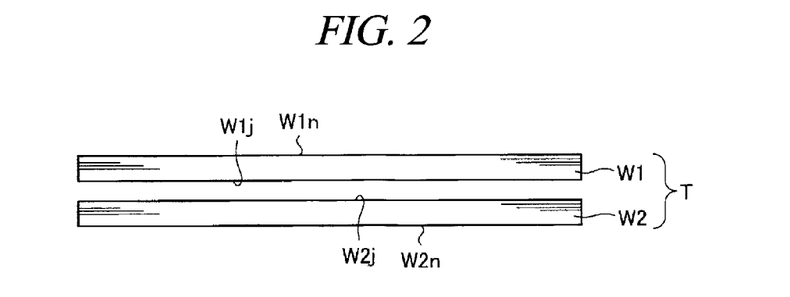
FIG. 2 is a schematic diagram illustrating a state of a first substrate and a second substrate before they are bonded according to the exemplary embodiment.

A bonding system 1 shown in FIG. 1 forms a combined substrate T by bonding the first substrate W1 and the second substrate W2 (see FIG. 2).

The first substrate W1 and the second substrate W2 are single crystalline silicon wafers, and a multiple number of electronic circuits are formed on surfaces of these substrates. The first substrate W1 and the second substrate W2 have the substantially same diameter. Further, either one of the first substrate W1 and the second substrate W2 may be a bare substrate on which no electronic circuit is formed.

In the following description, as shown in FIG. 2, among surfaces of the first substrate W1, a surface to be bonded to the second substrate W2 will be referred to as "bonding surface W1$j$", and a surface opposite to the bonding surface W1$j$ will be referred to as "non-bonding surface W1$n$". Further, among surfaces of the second substrate W2, a surface to be bonded to the first substrate W1 will be referred to as "bonding surface W2$j$", and a surface opposite to the bonding surface W2$j$ will be referred to as "non-bonding surface W2$n$."

As depicted in FIG. 1, the bonding system 1 includes a carry-in/out station 2 and a processing station 3. The carry-in/out station 2 is disposed at the negative X-axis side of the processing station 3, and connected as a single body with the processing station 3.

The carry-in/out station 2 includes a placing table 10 and a transfer section 20. The placing table 10 is equipped with a multiple number of placing plates 11. Respectively provided on the placing plates 11 are cassettes C1 to C4 each of which accommodates therein a plurality of (e.g., 25 sheets of) substrates horizontally. The cassette C1 accommodates therein a plurality of first substrates W1; the cassette C2, a plurality of second substrates W2; and the cassette C3, a plurality of combined substrates T. The cassette C4 is a cassette for collecting, for example, a problematic substrate. Further, the number of the cassettes C1 to C4 placed on the placing plates 11 is not limited to the shown example.

The transfer section 20 is provided adjacent to the positive X-axis side of the placing table 10. Provided in the transfer section 20 are a transfer path 21 extending in the Y-axis direction and a transfer device 22 configured to be movable along the transfer path 21. The transfer device 22 is configured to be movable in the X-axis direction as well as in the Y-axis direction and pivotable around the Z-axis. The transfer device 22 is also configured to transfer the first substrates W1, the second substrates W2 and the combined substrates T between the cassettes C1 to C4 placed on the placing plates 11 and a third processing block G3 of the processing station 3 to be described later.

As stated above, the carry-in/out station 2 transfers the first substrate W1 and the second substrate W2 to the processing station 3, and receives, from the processing station 3, the combined substrate T in which the first substrate W1 and the second substrate W2 are bonded to each other.

For example, three processing blocks G1, G2 and G3 are provided in the processing station 3. The first processing block G1 is disposed at a rear side (positive Y-axis side of FIG. 1) of the processing station 3, and the second processing block G2 is provided at a front side (negative Y-axis side of FIG. 1) of the processing station 3. Further, the third processing block G3 is disposed at a carry-in/out station 2 side (negative X-axis side of FIG. 1) of the processing station 3.

Provided in the first processing block G1 is a surface modifying apparatus 30 configured to modify the bonding surface W1$j$ of the first substrate W1 and the bonding surface W2$j$ of the second substrate W2. The surface modifying apparatus 30 forms a dangling bond on the bonding surface W1$j$ of the first substrate W1 and the bonding surface W2$j$ of the second substrate W2 by plasma radiation, thus allowing the bonding surfaces W1$j$ and W2$j$ to be modified such that they are easily hydrophilized afterwards.

Specifically, in the surface modifying apparatus 30, an oxygen gas or a nitrogen gas as a processing gas is excited into plasma under, for example, a decompressed atmosphere. As oxygen ions or nitrogen ions are radiated to the bonding surfaces W1$j$ and W2$j$ of the first and second substrates W1 and W2, the bonding surfaces W1$j$ and W2$j$ are modified by being plasma-processed.

Further, in the first processing block G1, a surface hydrophilizing apparatus 40 is disposed. The surface hydrophilizing apparatus 40 is configured to hydrophilize and clean the bonding surfaces W1$j$ and W2$j$ of the first substrate W1 and the second substrate W2 with, for example, pure water. To elaborate, the surface hydrophilizing apparatus 40 supplies the pure water onto the first substrate W1 or the second substrate W2 while rotating the first substrate W1 or the second substrate W2 held by, for example, a spin chuck. Accordingly, the pure water supplied onto the first substrate W1 or the second substrate W2 is diffused on the bonding surface W1$j$ of the first substrate W1 or the bonding surface W2$j$ of the second substrate W2, so that the bonding surfaces W1$j$ and W2$j$ are hydrophilized.

Here, though the surface modifying apparatus 30 and the surface hydrophilizing apparatus 40 are arranged side by side, the surface hydrophilizing apparatus 40 may be stacked on top of or under the surface modifying apparatus 30.

In the second processing block G2, a bonding apparatus 41 is disposed. That is, the processing station 3 is equipped with the bonding apparatus 41. The boning apparatus 41 is configured to bond the first substrate W1 and the second substrate W2, which are hydrophilized, by an intermolecular force. A specific configuration of the bonding apparatus 41 will be discussed later.

A transfer section 60 is formed in a region surrounded by the first processing block G1, the second processing block G2 and the third processing block G3. A transfer device 61 is disposed in the transfer section 60. The transfer device 61 is equipped with, for example, a transfer arm which is configured to be movable in a vertical direction and a horizontal direction and pivotable around a vertical axis. This transfer device 61 is moved within the transfer section 60 and transfers the first substrates W1, the second substrates W2 and the combined substrates T to preset devices within the first processing block G1, the second processing block G2 and the third processing block G3 which are adjacent to the transfer section 60.

Furthermore, the bonding system 1 includes a control device 70. The control device 70 controls an operation of the bonding system 1. This control device 70 may be implemented by, for example, a computer and includes a controller and a storage which are not illustrated. The controller includes a microcomputer having a CPU (Central Processing Unit), a ROM (Read Only Memory), a RAM (Random Access Memory), an input/output port, and so forth; and various kinds of circuits. The CPU of the microcomputer implements a control to be described later by reading out a program stored in the ROM and executing the program. Further, the storage may be implemented by, by way of non-limiting example, a semiconductor memory device such as a RAM or a flash memory, or a storage device such as a hard disk or an optical disk.

Further, the program may be recorded on a computer-readable recording medium and installed from the recording medium to the storage of the control device 70. The computer-readable recording medium may be, by way of non-limiting example, a hard disk HD, a flexible disk FD, a compact disk CD, a magnetic optical disk MO, a memory card, or the like.

<Bonding Apparatus>

Figure 3:
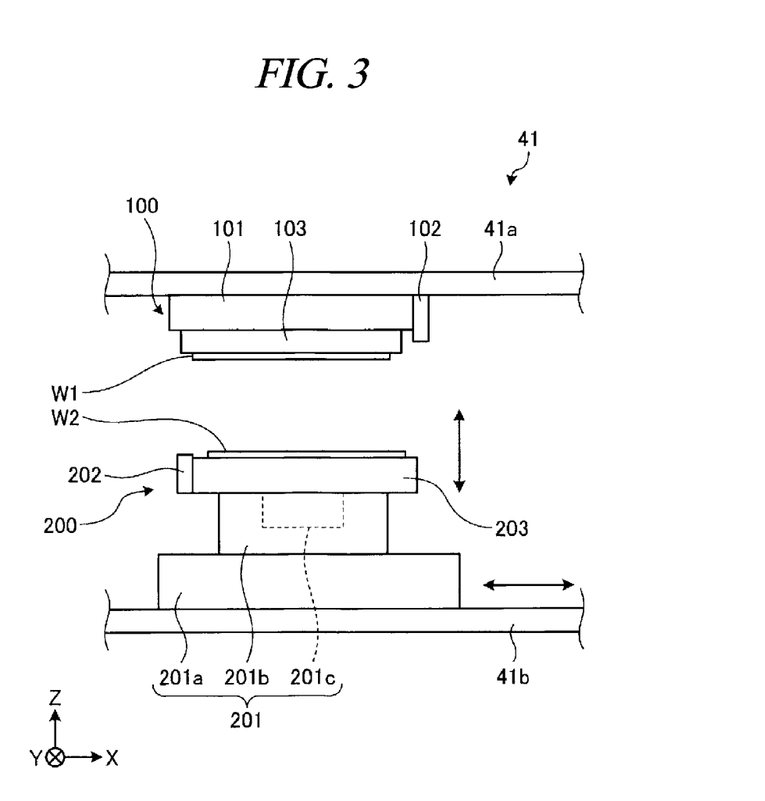
FIG. 3 is a schematic diagram illustrating a configuration of a part of a bonding apparatus according to the exemplary embodiment.

The bonding apparatus 41 is equipped with, as illustrated in FIG. 3, a first holding device 100 and a second holding device 200. FIG. 3 is a schematic diagram illustrating a configuration of a part of the bonding apparatus 41 according to the exemplary embodiment.

The first holding device 100 includes a rotation device 101, a first height measurement device 102, and a first chuck device 103. The first holding device 100 is configured to attract and hold the first substrate W1 by the first chuck device 103. Details of the first chuck device 103 will be elaborated later. Specifically, the first chuck device 103 attracts the non-bonding surface Win of the first substrate W1.

The rotation device 101 is mounted to a ceiling portion 41a of a processing vessel of the bonding apparatus 41. The rotation device 101 is configured to support the first chuck device 103 rotatably. The rotation device 101 rotates the first chuck device 103 around an axis extending in the Z-axis direction.

The first height measurement device 102 is mounted to the ceiling portion 41a of the processing vessel. Alternatively, the first height measurement device 102 may be mounted to the rotation device 101 or the first chuck device 103. The first height measurement device 102 is configured to measure a height of the bonding surface W2j of the second substrate W2.

The first height measurement device 102 is an alignment camera using, for example, a CCD camera. The first height measurement device 102 images an alignment pattern formed at the second substrate W2, recognizes the alignment pattern, and outputs a height where the alignment pattern is in focus as the height of the bonding surface W2j of the second substrate W2.

The first height measurement device 102 may be a displacement sensor. The displacement sensor is, by way of example, a laser displacement gauge. The displacement sensor measures the height of the bonding surface W2j of the second substrate W2 by radiating laser light toward a second chuck device 203 and the second substrate W2 and receiving reflection light thereof. The first holding device 100 may be equipped with both the alignment camera and the displacement sensor as the first height measurement device 102.

The second holding device 200 is equipped with a moving device 201, a second height measurement device 202, and the second chuck device 203. The second holding device 200 is configured to attract and hold the second substrate W2 by the second chuck device 203. Details of the second chuck device 203 will be elaborated later. Specifically, the second chuck device 203 attracts the non-bonding surface W2n of the second substrate W2.

The moving device 201 is configured to move the second height measurement device 202 and the second chuck device 203 in a horizontal direction and a vertical direction. The moving device 201 includes a first moving device 201a, a second moving device 201b, and a third moving device 201c.

The first moving device 201a is configured to move the second height measurement device 202 and the second chuck device 203 along a rail which is extended in the Y-axis direction at a floor portion 41b of the processing vessel. The second moving device 201b is mounted on top of the first moving device 201a. The second moving device 201b is configured to move the second height measurement device 202 and the second chuck device 203 along a rail which is extended in the X-axis direction on a top surface of the first moving device 201a. The third moving device 201c is mounted to the second moving device 201b and configured to move the second height measurement device 202 and the second chuck device 203 in the vertical direction.

The second height measurement device 202 is mounted to the second chuck device 203. The second height measurement device 202 is configured to measure a height of the bonding surface W1j of the first substrate W1. Like the first height measurement device 102, the second measurement device 202 may be implemented by an alignment sensor and/or a displacement sensor.

<First Chuck Device>

Figure 4:
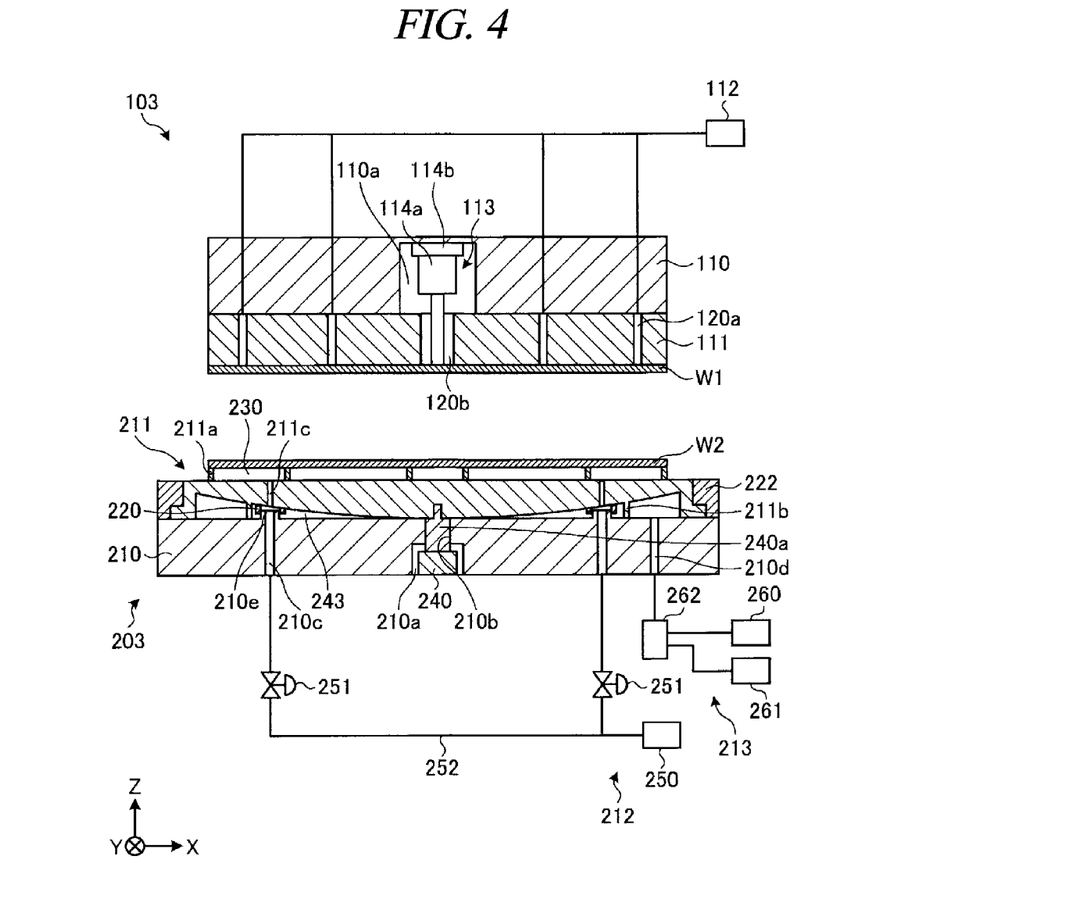
FIG. 4 is a schematic diagram illustrating a configuration of a first chuck device and a second chuck device according to the exemplary embodiment.

Now, the first chuck device 103 will be explained with reference to FIG. 4. FIG. 4 is a schematic diagram illustrating a configuration of the first chuck device 103 and the second chuck device 203 according to the exemplary embodiment.

The first chuck device 103 is equipped with a supporting member 110, a first holder 111, a first suction device 112, and a first transforming device 113.

The supporting member 101 is rotatably mounted to the rotation device 101 (see FIG. 3). The supporting member 110 has a circular shape. A first accommodation space 110a for accommodating therein the first transforming device 113 is formed in the supporting member 110. The first accommodation space 110a is formed in a center of the supporting member 110.

The first holder 111 is mounted to a bottom surface of the supporting member 110 and fixed to the supporting member 110. The first holder 111 has a circular shape. The first holder 111 has a suction hole 120a and an insertion hole 120b formed therein. The first holder 111 attracts and holds the first substrate W1 from above it.

The suction hole 120a is plural in number, and these suction holes 120a are formed in a peripheral portion and a middle portion of the first holder 111. The insertion hole 120b is formed in a center of the first holder 111, and a leading end of an actuator 114a of the first transforming device 113 to be described later is inserted in this insertion hole 120b.

The first suction device 112 is connected to the suction holes 120a. The first suction device 112 is, by way of example, a vacuum pump. As evacuation is performed by using the first suction device 112, a peripheral portion of the first substrate W1 is attracted to and held by the first holder 111.

The first transforming device 113 is provided in the first accommodation space 110a formed in the supporting member 110. A part of the first transforming device 113 may be provided in the rotation device 101 (see FIG. 3). The first transforming device 113 includes the actuator 114a and a cylinder 114b.

The actuator 114a is configured to generate a steady pressure in a particular direction by air supplied from an electro-pneumatic regulator (not shown). The actuator 114a is capable of generating the steady pressure regardless of a point of action of the pressure. The leading end of the actuator 114a comes into contact with a central portion of a top surface of the first substrate W1, and the actuator 114 is capable of controlling a press load applied to the central portion of the first substrate W1.

The cylinder 114b is configured to support the actuator 114a. The cylinder 114b moves the actuator 114a in the vertical direction by a driving unit incorporating, for example, a motor.

The first transforming device 113 controls the press load upon the first substrate W1 by using the actuator 114a, and controls the movement of the actuator 114a with the cylinder 114b. The first transforming device 113 presses down the central portion of the first substrate W1 attracted to and held by the first holder 111, thus rendering the first substrate W1 gently curved downwards. That is, the first transforming device 113 allows the central portion of the first substrate W1 held by the first holder 111 to be protruded downwards. The first transforming device 113 is capable of adjusting a protruding amount of the central portion of the first substrate W1 by controlling a moving amount of the actuator 114a.

<Second Chuck Device>

Figure 5:
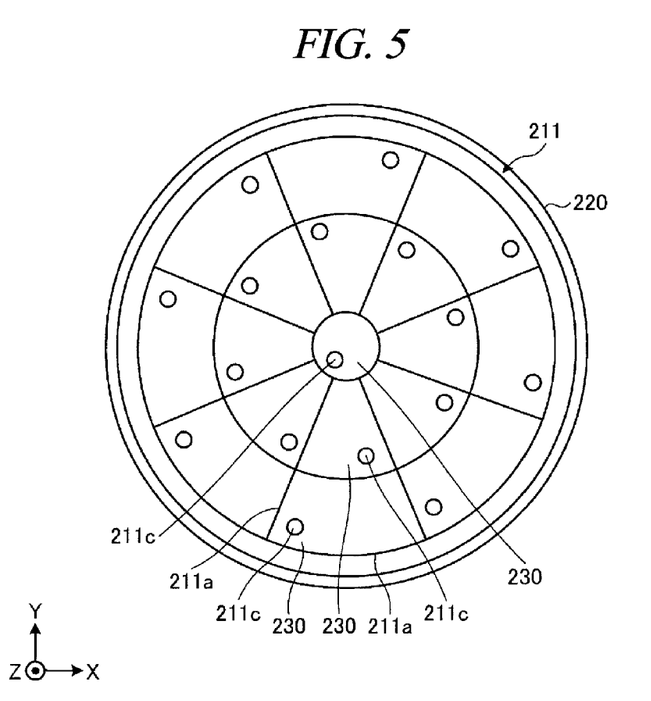
FIG. 5 is a schematic plan view illustrating a second holder according to the exemplary embodiment.

Now, the second chuck device 203 will be explained with reference to FIG. 4 and FIG. 5. FIG. 5 is a schematic plan view illustrating a second holder 211 according to the exemplary embodiment. The second chuck device 203 includes a base 210, the second holder 211, a second suction device 212, and a second transforming device 213.

The base 210 is mounted to the third moving device 201c (see FIG. 3). The base 210 is of a circular shape. An accommodation space 210a for accommodating therein a measurement device 240 is formed in the base 210. The accommodation space 210a is formed in a center of the base 210.

The base 210 has an insertion hole 210b formed therein. The insertion hole 210b communicates with the accommodation space 210a. The insertion hole 210b is formed in the center of the base 210.

The base 210 (an example of a base member) forms, between the second holder 211 and itself, a pressure-variable space 243 (an example of a transformation space) configured to be pressurized to allow the second holder 211 to be protruded upwards and the second holder 211. The second holder 211 is mounted on the base 210.

Further, a suction hole 210c and an intake/exhaust hole 210d are formed in the base 210. The suction hole 210c is plural in number. Seal members 220 are provided around the suction holes 210c.

Each of the seal members 220 is mounted to the base 210 and hermetically seals the pressure-variable space 243 and the suction holes 210c. The seal member 220 is expansible and contractible. The seal member 220 may be, by way of non-limiting example, a lip seal. The seal member 220 is mounted to, for example, a protrusion 210e protruded upwards from the base 210. The seal member 220 is in contact with a bottom surface of the second holder 211.

The second holder 211 is provided under the first holder 111, and attracts and holds the second substrate W2 to be bonded to the first substrate W1 from below it. The second holder 211 is provided on the base 210. The second holder 211 has a circular shape. A clamp ring 222 is provided around the second holder 211. The second holder 211 is fixed to the base 210 by the clamp ring 222.

The second holder 211 is made of a ceramic material such as, but not limited to, alumina ceramic or silicon carbide. The second holder 211 is expandable and contractable in the vertical direction and the horizontal direction. The second holder 211 is capable of forming a high-precision flat surface with high resilience.

A top surface of the second holder 211 is of a circular shape. A diameter of the top surface of the second holder 211 is larger than a diameter of the second substrate W2. A thickness of a central portion of the second holder 211 is larger than a thickness of a peripheral portion thereof. A first rib 211a (an example of a wall member) is provided on the top surface of the second holder 211. The first rib 211a may be provided as a separate body from the second holder 211 and mounted to the second holder 211, or may be formed as one body with the second holder 211. The first rib 211a divides an attraction region of the second substrate W2 into multiple division regions 230. That is, the attraction region of the second substrate W2 includes the multiple division regions 230.

The first rib 211a divides the attraction region into the multiple division regions 230 so that the second substrate W2 is attracted and held while distortions of the second substrate W2 in, for example, the X-axis direction, the Y-axis direction and an inclined direction are suppressed.

To elaborate, the first rib 211a divides the attraction region into the multiple division regions 230 along a diametrical direction of the second holder 211, that is, along a diametrical direction of the second substrate W2. By way of example, the first rib 211a partitions the attraction region into three division regions 230 along the diametrical direction of the second holder 211. Here, however, the number of the division regions 230 divided along the diametrical direction of the second holder 211 is not limited thereto as long as more than one division regions 230 are provided.

Further, the first rib 211a divides the attraction regions into a plurality of division regions 230 along a circumferential direction of the second holder 211, that is, along a circumferential direction of the second substrate W2.

By way of example, the first rib 211a divides a division region 230 formed at the outermost part of the second holder 211 into a multiplicity of division regions 230 along the circumferential direction of the second holder 211. For example, the first rib 211a partitions the division region 230 at the outermost part of the second holder 211 into eight division regions 230 along the circumferential direction of the second holder 211.

Further, the first rib 211a divides a division region 230 formed adjacent to and inside the outermost part of the second holder 211 into a multiplicity of division regions 230 along the circumferential direction of the second holder 211. By way of example, the first rib 211a partitions the division region 230 adjacent to and inside the outermost part of the second holder 211 into eight division regions 230 along the circumferential direction of the second holder 211.

Further, the number of the division regions 230 divided along the circumferential direction of the second holder 211 is not limited thereto as long as more than one division regions 230 are provided.

In addition, the first rib 211a may divide a division region at the centermost part of the second holder 211 in the diametrical direction thereof into a multiplicity of division regions 230 along the circumferential direction of the second holder 211. That is, the first rib 211a further divides at least one division region 230 among the plurality of division regions 230 formed along the diametrical direction of the second holder 211 into a multiplicity of division regions 230 along the circumferential direction of the second holder 211.

Moreover, the first rib 211a may divide the attraction region into a plurality of division regions 230 along either the diametrical direction or the circumferential direction of the second holder 211.

A second rib 211b is provided on the bottom surface of the second holder 211. The second holder 211b comes into contact with the base 210 when the top surface of the second holder 211 is leveled. The pressure-variable space 243 is formed between the bottom surface of the second holder 211 and the top surface of the base 210.

Multiple suction holes 211c are formed in the second holder 211. The suction holes 211c correspond to the division regions 230, respectively. That is, the suction hole 211c is formed for each division region 230. That is, the second holder 211 has the multiple suction holes 211c corresponding to the multiple division regions 230, respectively.

The seal members 220 are in contact with a portion of the bottom surface of the second holder 211 around the suction holes 211c. The suction holes 211c communicate with the suction holes 210c formed in the base 210 with the seal members 220 therebetween.

The second suction device 212 is equipped with a vacuum pump 250 and a plurality of regulators 251. The vacuum pump 250 is connected to the respective suction holes 210c via a pipeline 252. That is, the vacuum pump 250 is connected to the multiple suction holes 211c formed in the second holder 211. The second suction device 212 attracts the second substrate W2 via the multiple suction holes 211c.

The plurality of regulators 251 are provided at the pipeline 252 connected to the respective suction holes 211c, and adjust suctioning forces in the respective suction holes 211c, that is, attracting forces for the second substrate W2 in the respective division regions 230.

As evacuation is performed by the vacuum pump 250 and the respective regulators 251 are controlled, the attracting forces for the second substrate W2 in the respective division regions 230 are individually adjusted, so that the second substrate W2 is attracted to and held by the second holder 211. The second suction device 212 is controlled by the control device 70 (see FIG. 1). That is, the vacuum pump 250 and the regulators 251 are controlled by the control device 70 to adjust the attracting forces in the respective division regions 230 individually. As described, the second suction device 212 (an example of a suction device) generates the different attracting forces in the multiple division regions 230 included in the attraction region of the second substrate W2.

Further, the second suction device 212 may be provided with a plurality of vacuum pumps 250, and the attracting force for the second substrate W2 in each division region 230 may be adjusted by corresponding one of the plurality of vacuum pumps 250.

The second transforming device 213 is equipped with a vacuum pump 260 and an electro-pneumatic regulator 261.

The vacuum pump 260 is connected to the intake/exhaust hole 210d via a switching valve 262. As evacuation is performed by the vacuum pump 260, the pressure-variable space 243 is decompressed. As the pressure-variable space 243 is decompressed, the second rib 211b of the second holder 211 comes into contact with the base 210. In this case, the top surface of the second holder 211 is leveled.

The electro-pneumatic regulator 261 is connected to the intake/exhaust hole 210d via the switching valve 262. The electro-pneumatic regulator 261 supplies air to the pressure-variable space 243 and pressurizes the pressure-variable space 243. Accordingly, the second holder 221 is pressed from below it. The peripheral portion of the second holder 211 is fixed to the base 210 by the clamp ring 222. Accordingly, if the second holder 211 is pressed from below, the central portion of the second holder 211 is protruded upwards, higher than the peripheral portion thereof.

The switching valve 262 switches a connection state of the intake/suction hole 210d: between a state where the intake/suction hole 210d is connected to the vacuum pump 260 and a state where the intake/suction hole 210d is connected to the electro-pneumatic regulator 261.

The second transforming device 213 pressurizes the pressure-variable space 243, thus allowing the central portion of the second substrate W2 held by the second holder 211 to be protruded upwards. Accordingly, the second substrate W2 is gently curved. That is, the second transforming device 213 transforms the second substrate W2 held by the second holder 211 such that the central portion of the second substrate W2 is protruded higher than the peripheral portion thereof. The second transforming device 213 is capable of adjusting a protruding amount of the central portion of the second substrate W2 by adjusting a pressure of the pressure-variable space 243.

The measurement device 240 is configured to measure a protruding amount of the second holder 211, that is, the protruding amount of the central portion of the second substrate W2. The measurement device 240 may be, by way of non-limiting example, an electrostatic capacitance sensor. The electrostatic capacitance sensor measures a variation in electrostatic capacitance formed by a sensor surface and a measurement target 240a as a distance between the sensor surface and the measurement target 240a.

The measurement target 240a is mounted to a center of the bottom surface of the second holder 211 and moved up and down along with the second holder 211. The measurement target 240a is inserted in the insertion hole 210b of the base 210. A seal member (not shown), for example, a V-ring is provided around the measurement target 240a.

<Bonding Processing>

Figure 6:
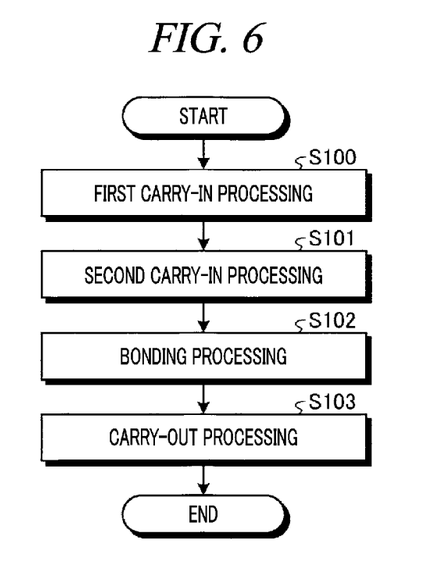
FIG. 6 is a flowchart for describing a bonding processing according to the exemplary embodiment.

Now, a bonding processing according to the exemplary embodiment will be explained with reference to FIG. 6. FIG. 6 is a flowchart illustrating the bonding processing according to the exemplary embodiment. Individual processings shown in FIG. 6 are performed under the control of the control device 70.

The control device 70 performs a first carry-in processing (S100). The control device 70 controls the transfer device 61 to carry the first substrate W1, which is modified by the surface modifying apparatus 30 and hydrophilized by the surface hydrophilizing apparatus 40, into the bonding apparatus 41. Then, after inverting the first substrate W1 such that the non-bonding surface Win of the first substrate W1 faces upward, the control device 70 controls the first chuck device 130 to attract and hold the non-bonding surface Win of the first substrate W1.

The control device 70 performs a second carry-in processing (S101). The order of the first carry-in processing and the second carry-in processing may be reversed. The control device 70 controls the transfer device 61 to carry the second substrate W2, which is modified by the surface modifying apparatus 30 and hydrophilized by the surface hydrophilizing apparatus 40, into the bonding apparatus 41. Then, the control device 70 controls the second chuck device 203 to attract and hold the non-bonding surface W2n of the second substrate W2.

The control device 70 controls the second suction device 212 (an example of the suction device). To elaborate, the control device 70 controls the vacuum pump 250 and the regulators 251 to generate preset attracting forces for the individual division regions 230, thus allowing the second substrate W2 to be attracted and held. The control device 70 attracts and holds the second substrate by generating the different attracting forces in the multiple division regions 230. Further, the multiple division regions 230 may include division regions in which a same attracting force is generated.

Figure 7:
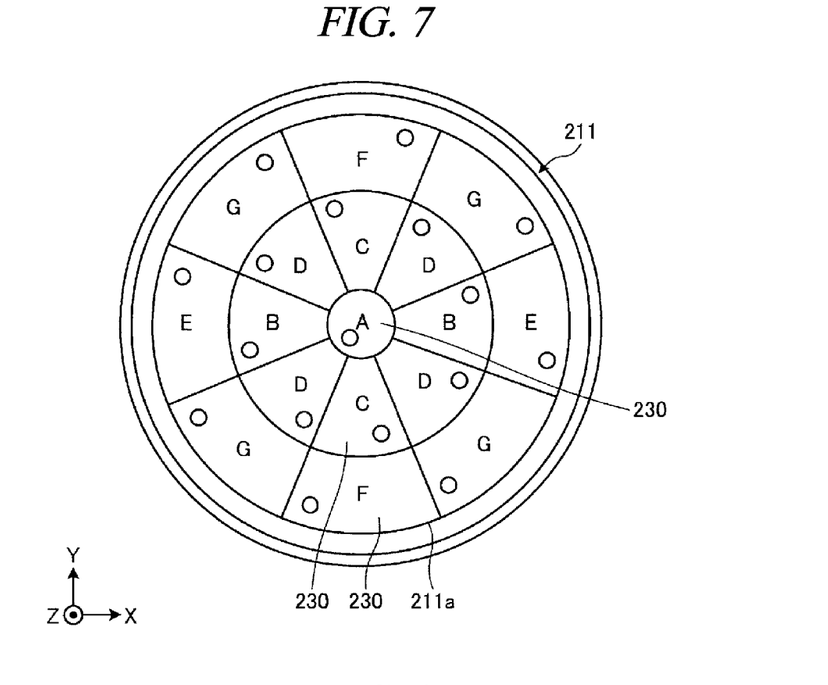
FIG. 7 is a diagram showing an example distribution of attracting forces in division regions.

By way of example, the control device 70 generates the attracting forces by grouping the multiple division regions 230 into "A" to "G", as illustrated in FIG. 7. FIG. 7 is a diagram illustrating an example distribution of the attracting forces in the division regions 230 according to the exemplary embodiment. In FIG. 7, the same attracting force is generated in division regions 230 which are assigned the same notation.

Further, the control device 70 may control the vacuum pump 250 and the regulators 251 to generate the preset attracting forces in the individual division regions 230 after the second substrate W2 is attracted and held by a same attracting force in the individual division regions 230.

The control device 70 performs a bonding processing (process S102). To elaborate, the control device 70 adjusts positions of the first substrate W1 and the second substrate W2 in the vertical direction after adjusting positions of the first substrate W1 and the second substrate W2 in the horizontal direction.

Thereafter, the control device 70 controls the first transforming device 113 to press down the central portion of the first substrate W1 attracted to and held by the first holder 11, thus rendering the first substrate W1 gently curved downwards.

Further, the control device 70 controls the electro-pneumatic regulator 261 to supply the air into the pressure-variable space 243, thus allowing the pressure-variable space 243 to be pressurized. Accordingly, the second substrate W2 attracted to and held by the second holder 211 is gently curved upwards. Further, the second substrate W2 is attracted to the second holder 211 by the attracting forces generated in the individual division regions 230.

Figure 8:
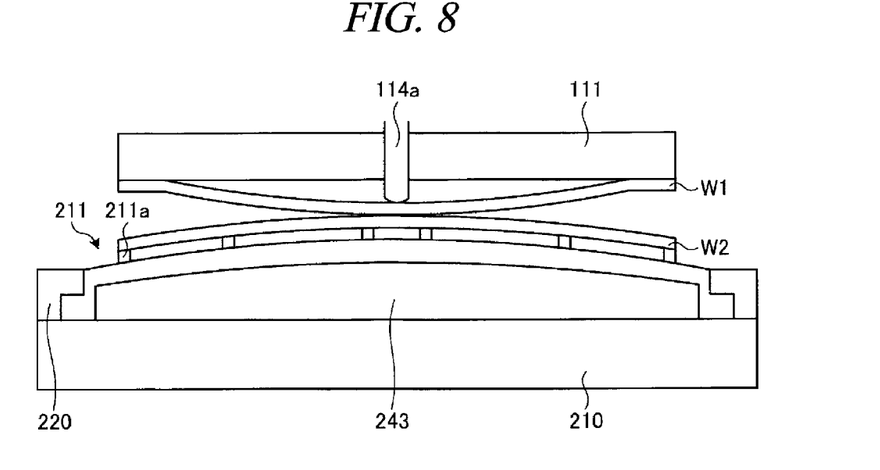
FIG. 8 is a schematic diagram illustrating a state in which bonding of the first substrate and the second substrate is begun in the bonding apparatus according to the exemplary embodiment.

Accordingly, as depicted in FIG. 8, the central portion of the first substrate W1 and the central portion of the second substrate W2 come into contact with each other, and bonding of the central portion of the first substrate W1 and the central portion of the second substrate W2 is begun. FIG. 8 is a schematic diagram illustrating a state in which the bonding between the first substrate W1 and the second substrate W2 is begun in the bonding apparatus 41 according to the exemplary embodiment.

Since the first substrate W1 and the second substrate W2 are subjected to the surface modifying processing, a Van der Waals force (intermolecular force) is generated, so that the bonding surface W1*j* of the first substrate W1 and the bonding surface W2*j* of the second substrate W2 are bonded by this Van der Waals force. Further, since the first substrate W1 and the second substrate W2 are hydrophilized, hydrophilic groups of the bonding surface W1*j* of the first substrate W1 and the bonding surface W2*j* of the second substrate W2 are hydrogen-bonded, so that the bonding surface W1*j* of the substrate W1 and the bonding surface W2*j* of the substrate W2 are firmly bonded.

Then, the control device 70 stops the suctioning by the first suction device 112. Accordingly, the attracting and holding of the first substrate W1 by the first holder 111 is released, and the entire first substrate W1 including the central portion and the peripheral portion thereof falls on the second substrate W1. The first substrate W1 and the second substrate W2 are then bonded, so that the combined substrate T is formed.

As stated above, the control device 70 performs the bonding between the first substrate W1 and the second substrate W2 by generating the different attracting forces in the multiple division regions 230.

The control device 70 performs a carry-out processing (S103). The control device 70 controls the transfer device 61 to carry out the combined substrate T from the bonding apparatus 41.

<Effects>

The bonding apparatus 41 is equipped with the first holder 111, the first transforming device 113, the second holder 211, the second transforming device 213, the second suction device 212 (an example of the suction device), and the control device 70. The first holder 111 attracts and holds the first substrate W1 from above it. The first transforming device 113 allows the central portion of the first substrate W1 held by the first holder 111 to be protruded downwards. The second holder 211 is provided under the first holder 111, and attracts and holds the second substrate W2 to be bonded to the first substrate W1 from below it. The second transforming device 213 allows the central portion of the second substrate W2 held by the second holder 211 to be protruded upwards. The second suction device 212 generates the different attracting forces in the multiple division regions 230 included in the attraction region of the second substrate W2. The control device 70 controls the second suction device 212.

With this configuration, the bonding apparatus 41 is capable of attracting and holding the second substrate W2 by the different attracting forces generated in the multiple division regions 230. Therefore, the bonding apparatus 41 is capable of suppressing a distortion of the second substrate W2 attracted to and held by the second holder 211 and a distortion of the combined substrate T, thus capable of improving bonding accuracy for the combined substrate T.

Further, the second holder 211 is equipped with the first rib 211*a* (an example of the wall member) which divides the attraction region into the multiple division regions 230.

With this configuration, the bonding apparatus 41 is capable of adjusting the attracting forces generated in the multiple division regions 230 with high precision. Thus, the distortion of the second substrate W2 can be suppressed, so that the bonding accuracy for the combined substrate T can be improved.

Furthermore, the first rib 211*a* divides the attraction region into the plurality of regions 230 along the diametrical direction of the second substrate W2.

Accordingly, the bonding apparatus 41 is capable of generating the different attracting forces in the diametrical direction of the second substrate W2, thus capable of suppressing the distortion of the second substrate W2 in the diametrical direction thereof. Therefore, the bonding apparatus 41 is capable of improving the bonding accuracy for the combined substrate T.

Moreover, the first rib 211*a* divides the attraction region into the plurality of division regions 230 along the circumferential direction of the second substrate W2.

Accordingly, the bonding apparatus 41 is capable of generating the different attracting forces in the circumferential direction of the second substrate W2, thus capable of suppressing the distortion of the second substrate W2 in the circumferential direction. Therefore, the bonding apparatus 41 is capable of improving the bonding accuracy for the combined substrate T.

In addition, the second holder 211 has the multiple suction holes 211c formed therein to correspond to the multiple division regions 230, respectively. The second suction device 212 attracts the second substrate W2 by the suctioning through the multiple suction holes 211c.

Accordingly, the bonding apparatus 41 is capable of adjusting the attracting force for each division region 230, so that the distortion of the second substrate W2 attracted to and held by the second holder 211 can be suppressed. Accordingly, the bonding apparatus 41 is capable of suppressing the distortion of the combined substrate T, thus capable of improving the bonding accuracy for the combined substrate T.

Additionally, the bonding apparatus 41 is equipped with the base 210 (an example of the base member) and the seal members 220. The base 210 forms, between the second holder 211 and itself, the pressure-variable space 243 (an example of the transformation space) which is pressurized to allow the second holder 211 to be protruded upwards. The second holder 211 is mounted on the base 210. The seal members 220 are mounted to the base 210 and hermetically seal the pressure-variable space 243 and the suction holes 211c. The seal member 220 is expansible and contractible. The seal member 220 is in contact with the bottom surface of the second holder 211.

With this configuration, the bonding apparatus 41 is capable of suppressing irregularities from being formed on the bottom surface of the second holder 211. Thus, when the pressure-variable space 243 is pressed to allow the second holder 211 to be protruded upwards, the bonding apparatus 41 is capable of suppressing the distortion of the top surface of the second holder 211, that is, the distortion of the second substrate W2. Thus, the bonding apparatus 41 is capable of suppressing the distortion of the combined substrate T, thus capable of improving the bonding accuracy for the combined substrate T.

Modification Examples

A control device 70 of a bonding apparatus 41 according to a modification example may change the attracting forces in the multiple division regions 230 during the bonding processing of the first substrate W1 and the second substrate W2. By way of example, the bonding apparatus 41 according to the modification example 41 may change the attracting forces in the multiple division regions 230 at a previously set timing. Further, the bonding apparatus 41 according to the modification example may change the attracting forces in some of the multiple division regions 230. Further, the bonding apparatus 41 according to the modification example may change the attracting forces in the multiple division regions 230 multiple times during the bonding processing. Here, the changing of the attracting forces includes setting the attracting forces to zero, that is, releasing the attracting of the second substrate W2 in the division regions 230.

Accordingly, the bonding apparatus 41 according to the modification example is capable of suppressing the distortion of the second substrate W2 in the bonding processing, thus capable of improving the bonding accuracy for the combined substrate T.

Moreover, during the bonding processing of the first substrate W1 and the second substrate W2, the bonding apparatus 41 according to the modification example may change the attracting forces in the multiple division regions 230 based on a state of the second substrate W2 in the bonding processing, for example, a temperature of the second substrate W2. The temperature of the second substrate W2 is detected by a temperature sensor provided at, for example, the second holder 211.

Accordingly, the bonding apparatus 41 according to the modification example is capable of suppressing the distortion of the second substrate W2 in the bonding processing, thus capable of improving the bonding accuracy for the combined substrate T.

Figure 9:
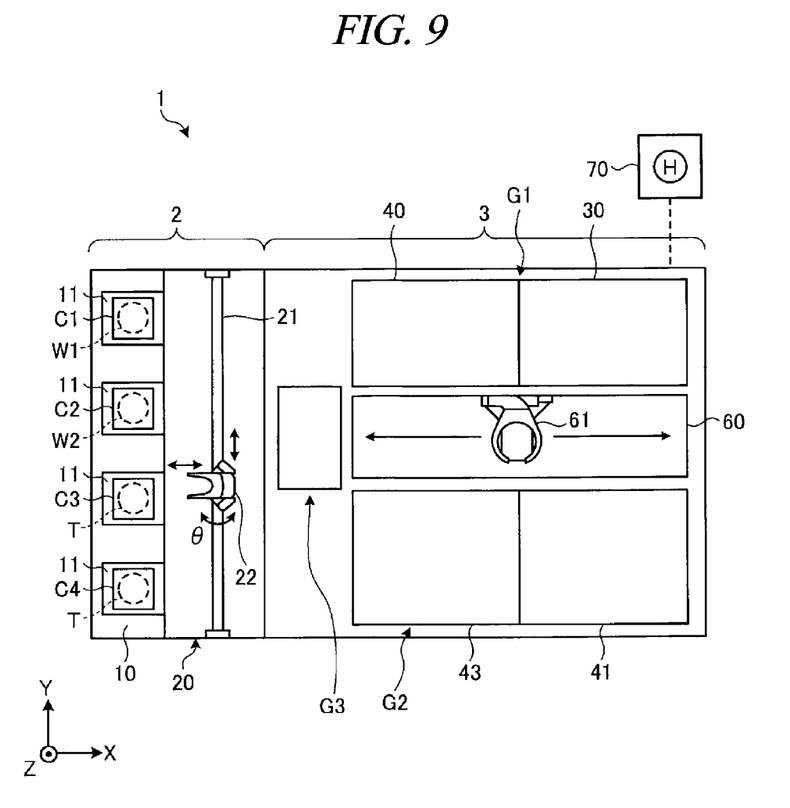
FIG. 9 is a schematic diagram illustrating a configuration of a bonding system according to a modification example of the exemplary embodiment.

In addition, the control device 70 of the bonding apparatus 41 according to the modification example may set the attracting forces in the multiple division regions 230 based on a state of the second substrate W2 before being bonded. The state of the second substrate W2 includes a thickness of the second substrate W2, a bending amount of the second substrate W2, a temperature of the second substrate W2, and so forth. A bonding system 1 according to the present modification example is equipped with a detecting device 43 configured to temporarily place the second substrate W2 and detect the state of the second substrate W2, as shown in FIG. 9. FIG. 9 is a schematic diagram illustrating a configuration of the bonding system 1 according to the present modification example of the exemplary embodiment.

Furthermore, during the bonding processing of the first substrate W1 and the second substrate W2, the bonding apparatus 41 according to the modification example may change the attracting forces in the multiple division regions 230 based on the state of the second substrate W2 before being bonded.

Accordingly, the bonding apparatus 41 according to the modification example is capable of setting the attracting forces in the division regions 230 based on the state of the second substrate W2. Therefore, the distortion of the second substrate W2 can be suppressed, and the bonding accuracy for the combined substrate T can be improved.

In addition, in the bonding apparatus 41 according to the modification example, a pressure-variable space may be formed between the first holder 111 and the supporting member 110 in the first chuck device 103, the same as in the second chuck 203. By pressurizing this pressure-variable space, the first substrate W1 may be gently curved downwards.

Further, the bonding apparatus 41 according to the modification example may include a rib configured to partition an attraction region of the first chuck 103 into multiple division regions 230 in the first cuck 103, the same as in the second chuck 203, and different attracting forces may be generated in these multiple division regions 230.

Accordingly, the bonding apparatus 41 according to the modification example is capable of suppressing the distortion of the first substrate W1, thus capable of improving the bonding accuracy for the combined substrate T.

Additionally, the bonding apparatus 41 according to the modification example may perform the bonding processing by appropriately combining the bonding apparatuses 41 according to the above-described modification example. By way of example, the bonding apparatus 41 according to the modification example may change the attracting forces in the multiple division regions 230 of the first chuck device 130 during the bonding processing of the first substrate W1 and the second substrate W2.

The above-described exemplary embodiments are illustrative in all aspects and are not anyway limiting. In fact, the above-described exemplary embodiments can be embodied in various forms. Further, the above-described exemplary embodiments may be omitted, replaced and modified in various ways without departing from the scope and the spirit of claims.

According to the exemplary embodiment, it is possible to improve the bonding accuracy for the substrates.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting. The scope of the inventive concept is defined by the following claims and their equivalents rather than by the detailed description of the exemplary embodiments. It shall be understood that all modifications and embodiments conceived from the meaning and scope of the claims and their equivalents are included in the scope of the inventive concept.

We claim:

1. A bonding apparatus, comprising:
   a first holder configured to attract and hold a first substrate from above;
   a first transforming device configured to transform the first substrate held by the first holder such that a central portion of the first substrate is protruded downwards;
   a second holder provided under the first holder, and configured to attract and hold a second substrate, which is to be bonded to the first substrate, from below;
   a second transforming device configured to transform the second substrate held by the second holder such that a central portion of the second substrate is protruded upwards;
   a suction device configured to generate different attracting forces in multiple division regions included in an attraction region of the second substrate;
   a control device configured to control the suction device;
   a base member on which the second holder is provided; and
   a transformation space, which is formed between the second holder and the base member as a single and unitary space, configured to be pressurized to allow the second holder to be protruded upwards,
   wherein the control device sets the attracting forces in the multiple division regions based on a state of the second substrate before being bonded such that a distortion of the second substrate is suppressed, and
   the state of the second substrate includes at least one of a temperature of the second substrate, a thickness of the second substrate, and a bending amount of the second substrate.

2. The bonding apparatus of claim 1,
   wherein the second holder is equipped with a wall member which divides the attraction region into the multiple division regions.

3. The bonding apparatus of claim 2,
   wherein the wall member divides the attraction region into the multiple division regions along a diametrical direction of the second substrate.

4. The bonding apparatus of claim 2,
   wherein the wall member divides the attraction region into the multiple division regions along a circumferential direction of the second substrate.

5. The bonding apparatus of claim 1,
   wherein multiple suction holes are formed in the second holder, and wherein each multiple suction hole corresponds with a division region of the multiple division regions, and
   the suction device attracts the second substrate via the multiple suction holes.

6. The bonding apparatus of claim 1,
   wherein the control device changes the attracting forces in the multiple division regions during a bonding processing of the first substrate and the second substrate.

7. A bonding apparatus, comprising:
   a first holder configured to attract and hold a first substrate from above;
   a first transforming device configured to transform the first substrate held by the first holder such that a central portion of the first substrate is protruded downwards;
   a second holder provided under the first holder, and configured to attract and hold a second substrate, which is to be bonded to the first substrate, from below;
   a second transforming device configured to transform the second substrate held by the second holder such that a central portion of the second substrate is protruded upwards;
   a suction device configured to generate different attracting forces in multiple division regions included in an attraction region of the second substrate;
   a control device configured to control the suction device;
   a base member on which the second holder is provided, a transformation space configured to be pressurized to allow the second holder to be protruded upwards being formed between the second holder and the base member; and
   seal members provided to the base member and configured to seal the transformation space and a plurality of suction holes formed in the second holder, the seal members being allowed to be expanded/contracted,
   wherein the seal members are in contact with a bottom surface of the second holder.

8. A bonding system, comprising:
   a processing station comprising a bonding apparatus as claimed in claim 1; and
   a carry-in/out station configured to transfer the first substrate and the second substrate into the processing station, and receive, from the processing station, a combined substrate in which the first substrate and the second substrate are bonded to each other.

9. A bonding method, comprising:
   attracting and holding a first substrate from above by a first holder;
   transforming the first substrate held by the first holder such that a central portion of the first substrate is protruded downwards;
   attracting and holding a second substrate from below by a second holder provided under the first holder;
   transforming the second substrate held by the second holder such that a central portion of the second substrate is protruded upwards; and
   bonding the first substrate and the second substrate by bringing the first substrate whose central portion is protruded downwards and the second substrate whose central portion is protruded upwards into contact with each other,
   wherein in the attracting and holding of the second substrate, the second substrate is attracted and held by different attracting forces generated in multiple division regions included in an attraction region of the second substrate,
   wherein the second holder is provided on a base member,
   a transformation space is formed between the second holder and the base member as a single and unitary space, and
   in the transforming of the second substrate, the transformation space is pressurized to allow the second holder to be protruded upwards.

10. A non-transitory computer-readable recording medium having stored thereon computer-executable instructions that, in response to execution, cause a bonding apparatus to perform a bonding method as claimed in claim 9.

* * * * *

UNITED STATES PATENT AND TRADEMARK OFFICE
CERTIFICATE OF CORRECTION

PATENT NO. : 11,715,663 B2
APPLICATION NO. : 17/181021
DATED : August 1, 2023
INVENTOR(S) : Kenji Sugakawa et al.

It is certified that error appears in the above-identified patent and that said Letters Patent is hereby corrected as shown below:

In the Specification

Column 5, Line 29, "Win" should be -- W1n --.

Column 10, Line 52, "Win" should be -- W1n --.

Column 10, Line 54, "Win" should be -- W1n --.

Signed and Sealed this
Thirtieth Day of April, 2024

Katherine Kelly Vidal
*Director of the United States Patent and Trademark Office*